United States Patent
Ayres et al.

(10) Patent No.: US 6,632,709 B2
(45) Date of Patent: Oct. 14, 2003

(54) ELECTRONIC DEVICE MANUFACTURE

(75) Inventors: John R. A. Ayres, Reigate (GB); Stanley D. Brotherton, Forest Row (GB); Carole A. Fisher, Horley (GB); Frnak W. Rohlfing, Reigate (GB); Nigel D. Young, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 35 days.

(21) Appl. No.: 09/821,130

(22) Filed: Mar. 29, 2001

(65) Prior Publication Data

US 2001/0031519 A1 Oct. 18, 2001

(30) Foreign Application Priority Data

Apr. 7, 2000 (GB) .............................. 0008487
Nov. 9, 2000 (GB) .............................. 0027333

(51) Int. Cl.[7] .......................... H01L 21/00; H01L 21/84
(52) U.S. Cl. .......................... 438/149; 438/30; 438/151; 438/159; 438/161; 438/163; 257/24; 257/336; 257/344; 257/408
(58) Field of Search ............................. 438/149–53, 30, 438/48, 159–163; 257/24, 72, 344, 336, 408

(56) References Cited

U.S. PATENT DOCUMENTS

| | | | |
|---|---|---|---|
| 5,130,829 A | | 7/1992 | Shannon |
| 5,627,084 A | * | 5/1997 | Yamazaki et al. ............ 437/21 |
| 5,770,486 A | | 6/1998 | Zhang et al. |
| 5,786,241 A | | 7/1998 | Shimada |
| 5,869,363 A | * | 2/1999 | Yamazaki et al. .......... 438/166 |
| 5,895,935 A | | 4/1999 | Yamazaki et al. ............ 257/59 |
| 5,994,172 A | * | 11/1999 | Ohtani et al. ................ 438/151 |
| 6,084,248 A | * | 7/2000 | Inoue .......................... 257/66 |
| 6,184,068 B1 | * | 2/2001 | Ohtani et al. ................ 438/151 |
| 2002/0040981 A1 | * | 4/2002 | Yamazaki et al. ............ 257/65 |

OTHER PUBLICATIONS

Patent Abstracts of Japan; Manufacture of Thin–Film Transistor; Sep. 16, 1994; Kouyuu Chiyou; 6–260499A.
AMI CD Workshop; WS 2/4: Process Technologies for Monolithic Low–Temperature Poly–Si TFT–LCDs; A. Yoshinouchi; T. Morita; M. Itoh; H. Yoneda; Y. Yamane; Y. Yamamoto; S. Tsuchimoto; F. Funada; K. Awane.
Japan Appl. Phys. vol. 37 (1998) pp. 1801–1808; Part 1, No. 4A, Apr. 1998; Analysis of Drain Field and Hot Carrier Stability of Poly–Si Thin Film Transistors; J. Richard Ayres, Stan D. Brotherton, David J. McCulloch; Michael J. Trainor.

* cited by examiner

Primary Examiner—Caridad Everhart
Assistant Examiner—Granvill D Lee, Jr.
(74) Attorney, Agent, or Firm—Aaron Waxler

(57) ABSTRACT

A method of fabricating an electronic device comprising a thin-film transistor, which addresses a problem of increased off-state current and reduced carrier mobility in self-aligned thin-film transistors. According to the method, a gate layer (2,46) is etched back underneath a mask layer (20,48). Following an implantation step using the mask layer as an implantation mask, the etch-back exposes implant damage which is then annealed by an energy beam (42).

20 Claims, 10 Drawing Sheets

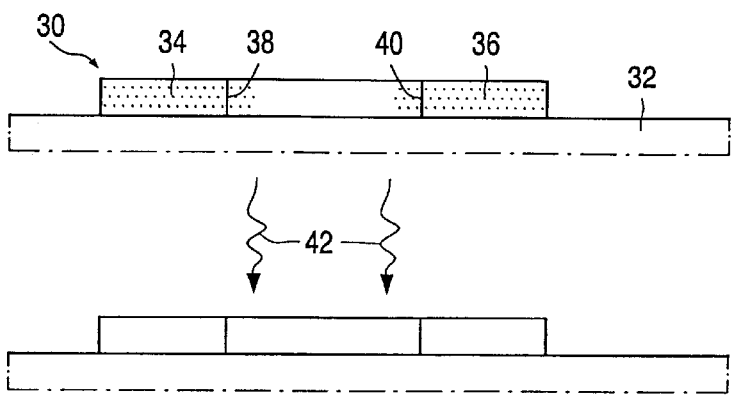
FIG. 10a
FIG. 10b
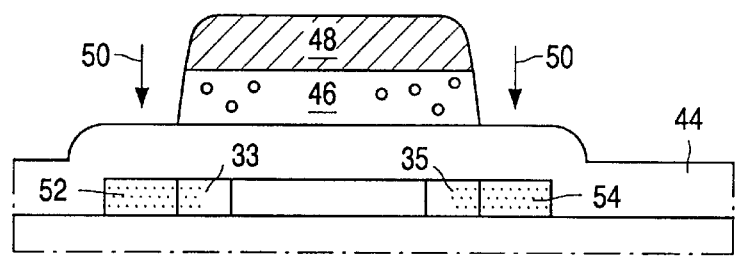
FIG. 10c
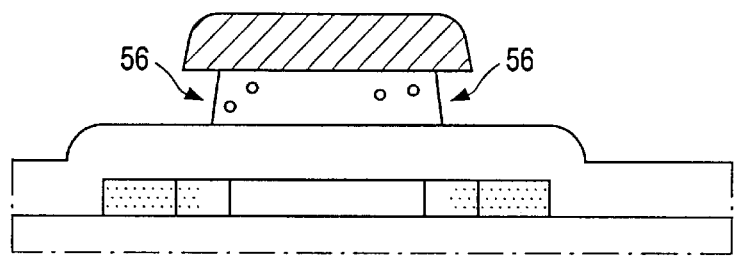
FIG. 10d
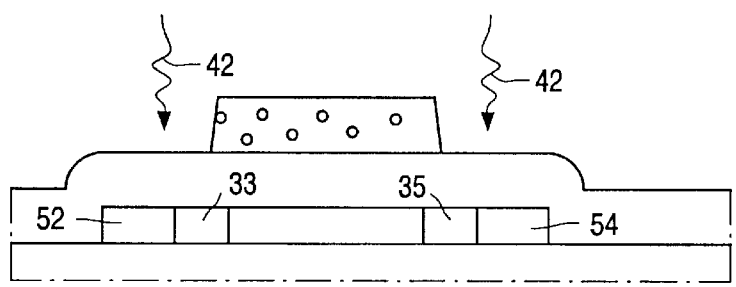
FIG. 10e
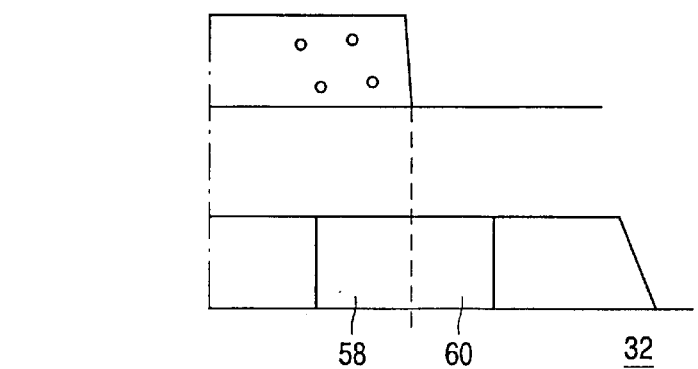
FIG. 10f

ELECTRONIC DEVICE MANUFACTURE

This invention relates to methods of manufacturing electronic devices comprising a thin-film transistor (hereinafter termed "TFT") and provides improved processes for fabricating the TFT using self-aligned techniques. The device may be a flat panel display (for example, an active-matrix liquid-crystal display, AMLCD), or a large area image sensor or several other types of large-area electronic device (for example, a thin-film data store or memory device).

There is much interest in developing thin-film circuits with TFTs and other thin-film circuit elements on insulating substrates for large-area electronics applications. These circuit elements fabricated with portions of an amorphous, microcrystalline or polycrystalline semiconductor film may form the switching elements in a cell matrix, for example in a flat panel display as described in U.S. Pat. No. 5,130,829 (our reference PHB 33646), the whole contents of which are hereby incorporated herein as reference material. In more recent years, the devices may also include integrated drive circuits, particularly with TFTs of polycrystalline silicon (hereinafter termed "polysilicon") as the circuit elements.

In the fabrication of a polysilicon TFT, it is known to use implantation of dopant ions (e.g. phosphorus) to form a region for a source/drain of the TFT in a self-aligned (hereinafter termed "SA") manner with a gate of the TFT. It is known to activate the implanted dopant and anneal the crystal lattice damage by directing an energy beam, particularly a laser beam, at the thin film structure.

The implanted region may be a highly doped drain region of the TFT. For a TFT used in a drive circuit, it can be advantageous to have a field-relief architecture comprising a low doped drain region (hereinafter termed "LDD") between the channel and drain region of the TFT. In this case, the implanted SA region may be the LDD region, or it may be the higher doped drain region. Thus, there may be no significant overlap between the gate and the LDD region, or the gate may overlap the LDD region in a so-called GOLDD architecture. Unfortunately, it is found that the resulting SA TFTs can suffer from an increase in off-state leakage current and a reduction in carrier mobility.

The present invention seeks to provide manufacturing methods and fabrication processes for SA TFTs of electronic devices, that permit various improvements in the characteristics of the TFTs and of the devices with the TFTs.

More particularly, the invention provides a method of fabricating an electronic device comprising a thin-film transistor, comprising the steps of:

(a) depositing a gate layer over an insulating film, which is over a semiconductor film;

(b) defining a patterned mask layer over the gate layer;

(c) etching to pattern the gate layer using the mask layer;

(d) implanting the semiconductor film, using the mask layer and/or the gate layer as an implantation mask;

(e) etching back the gate layer under the mask layer;

(f) removing the mask layer; and (g) annealing the semiconductor film with an energy beam.

In the case of TFTs with SA implanted regions, the inventors believe that an important: factor in increased off-state leakage currents and reduced carrier mobility is, lattice damage that extends beneath the edge of the gate and that is shielded by the gate from the laser anneal.

The mask layer may be a photoresist etchant mask, for example. The energy beam (particularly, but not exclusively, a laser beam) acts to anneal the implantation damage in the semiconductor film where not shielded/masked by the etched-back gate layer.

By this process, several of the problems due to implantation damage in SA polysilicon TFTs (with or without LDD or GOLDD) can be reduced or overcome or avoided.

Instead of the expression "gate etch-back", other terms may be used such as "gate over-etching" and "gate under-cut". Each expression refers to the etching process that results in an etched-back gate edge that is located under the mask layer so as to be offset/spaced from the edge of the mask window by a sufficient distance (gap) to permit the desired anneal of lattice damage in the intervening area. By controlling the extent of etching in step (c), the magnitude of the offset (gap) can be adjusted in accordance with the lateral extent of the semiconductor lattice damage as determined by different implantation dose levels.

The etch-back step (e) may be carried out after the implantation step (d). However, when the overlying mask pattern is thick & stable enough to mask the implantation by itself, then the step (e) can be carried out before step (d). Indeed this latter sequence has advantages. Laser annealing, (particularly, but not exclusively, with a UV excimer laser beam) is generally convenient for step (g). However, annealing with other types of energy beam may be used instead, e.g. using a high intensity UV flash lamp.

Although TFTs can be formed with other crystalline semiconductor materials, it is generally convenient to use polycrystalline silicon for the thin film semiconductor that provides the channel area of the TFT. The nature of the insulating substrate on which the TFTs are carried can vary, depending on the nature of the electronic device of which they form part. Typically the substrate may comprise a low-cost glass or an insulating polymer. Stainless steel may also be used.

In a preferred embodiment, etching steps (c) and (e) are carried out as a single processing step. This may provide more consistent results and more precise gap length control.

The method may include a further implantation step after step (f), providing a lower level of doping than step (d). This produces LDD regions between the source/drain regions formed in step (d) and the gate. This process may also be suitable for TFTs that operate at relatively low biases, that is, typically voltages up to approximately 5V. For these devices, a wider range of implantation doses may be employed in the further implantation step to reduce series; resistance, compared to doses normally used for creation of LDD field relief regions. Also, this technique allows the formation of shorter (typically sub-micron) LDD regions thereby reducing the series resistance of the region.

In another embodiment, step (b) comprises the steps of (h) defining a source/drain pattern mask layer; (i) performing an implantation step which provides a higher level of doping than step (d) to form source and drain regions defined by the source/drain pattern, with areas exposed only to the step (d) implantation forming LDD regions; and (j) patterning the mask layer to define a gate pattern. Alternatively, the method may include the further steps after step (c) of: (k) defining a source/drain pattern in another mask layer; and (I) performing an implantation step which provides a higher level of doping than step (d) to form source and drain regions defined by the source/drain pattern, with areas exposed only to the step (d) implantation forming LDD regions. Etch-back of the gate layer in these methods therefore creates gaps between the LDE regions and the edges of the gate layer. The implanted areas are fully exposed to the energy beam.

Another preferred method includes the steps of (m) defining an initial patterned mask layer; (n) performing an implantation step using the initial mask layer as an implantation mask, which implantation provides a lower level of doping than step (d) in regions extending laterally and inwardly beyond the edges of the patterned mask formed in step (b); and (o) annealing the semiconductor film with an energy beam. LDD regions can thus be formed which may extend under the gate of the finished device, in which the whole of the regions has been exposed to an energy beam to repair implant damage.

The method may include the step (p) of anodising the gate layer prior to etch-back step (e). Implantation step (d) is preferably carried out before step (p) as the step (d) may serve to harden the mask layer prior to the anodisation of step (p).

The gate layer may be of metal, or a semiconductor (e.g. polysilicon), or a combination of materials. Preferably, it comprises aluminium or a titanium and aluminium dual layer. The gate may be etched back in step (e) by a distance of 3 $\mu$m or less, and more preferably, by 0.25 to 0.5 $\mu$m.

Methods embodying the invention will now be described by way of example and with reference to the accompanying drawings, wherein:

FIG. 10 shows a process sequence for fabricating SA GOLDD TFTs according to the invention.

Figure 1:
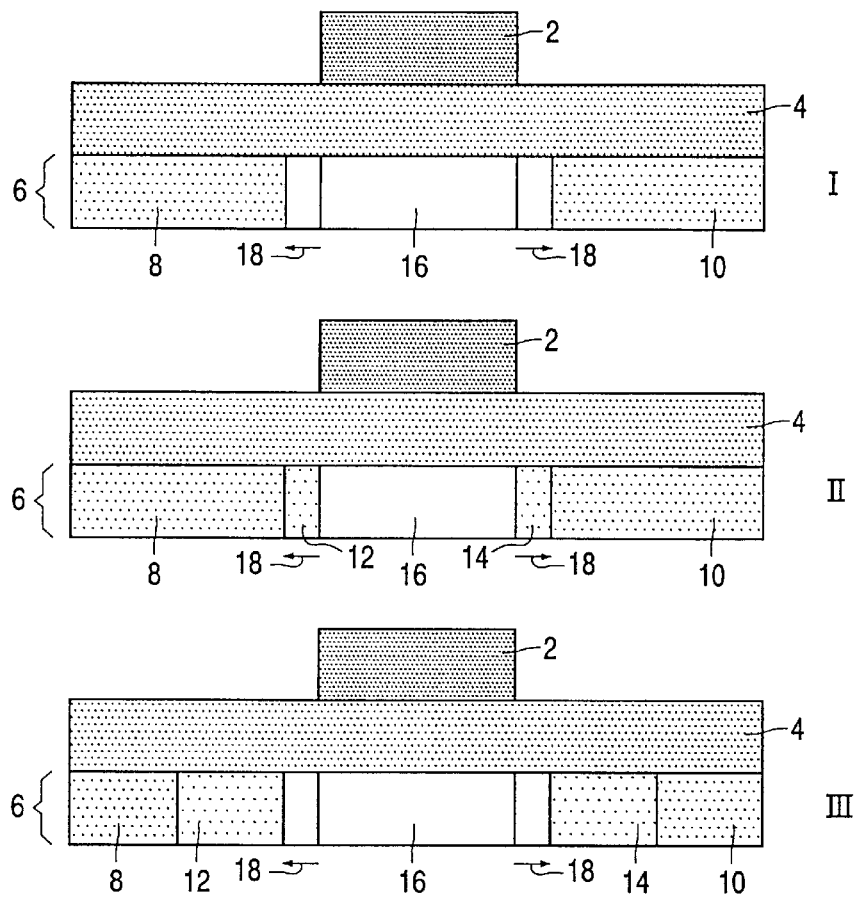
FIG. 1 shows schematic device structures of SA TFTs fabricated using the gate etch-back method of the invention.

Problems associated with conventional SA LDD devices are residual implant damage, which degrades both on- and off-current, and poor stability. The introduction of a sub-micron offset region in SA LDD devices allows full removal of implant damage by a laser, resulting in a higher on-current and a considerable reduction of the drain field. The resulting TFTs also show reduced sensitivity to gate enhanced leakage currents due to the poorer gate-drain coupling. In the case of a GOLDD TFT, the offset region defined by the etch-back can be part of a previously implanted, previously annealed LDD region. In this case, etch-back after the subsequent implantation of the high doped drain region allows full removal of the subsequent implant damage (so reducing leakage currents) and a tailored minimisation of the gate-drain capacitance.

Field-relief architectures are employed for the n-channel TFTs in polysilicon based CMOS devices in order to meet the stability criteria required for current AMLCD applications and other system-on-panel devices. Self-aligned aligned (SA) and non-SA (NSA) n-channel TFTs without field relief display unacceptable device instabilities in the form of on-current loss and leakage current increase at low drain voltages, whilst a drain bias of 15V can be applied to the corresponding p-channel devices without any detectable device degradation. In this connection, reference can be made to, for example, the article by J A Ayres, S D Brotherton, D J McCulloch and M J Trainor, in Jpn. J. Appl. Phys. 37, 1801 (1998), the whole contents of which are hereby incorporated herein as background material.

SA LDD TFTs, in which the field-relief regions are self-aligned to the gate, have been studied, and, although moderate improvements in device stability have been demonstrated compared to the corresponding SA devices, their stability is still not sufficient for current AMLCD applications. Furthermore, SA LDD devices are characterised by a high leakage current as well as a reduced on-current, both of which the applicants attribute to lattice damage from the n⁻phosphorus implant.

The embodiments described herein consist of SA structures with field-relief regions outside or substantially outside the gate, which address some of the issues that have been identified above for conventional SA LDD devices. Controlled over-etching of the gate metal beneath the resist mask that defines the gate is implemented. The small gap that is produced by the over-etching of the gate is used to provide field relief at the drain, which improves device stability and reduces the avalanche current. Field relief may be achieved either by a low-dose implant into this gap to form an LDD region, or by the diffusion of the dopant from an adjacent LDD or the source/drain into the gap during excimer laser activation. Compared to conventional SA LDD devices, the former field-relief architecture permits a reduction in LDD length, which will reduce series resistance, whilst the latter architecture enables complete implant damage removal and the formation of broadened junctions by the use of a laser. This results in a higher mobility and reduces the drain field.

The electrical characteristics of the TFT structures and their stability are discussed below, and these are compared to SA LDD devices.

FIG. 1 shows cross-sections of TFT architectures fabricated according to the method of the invention, labelled I, II and III, respectively.

Each device comprises a gate electrode 2 above a gate insulating layer 4. The gate electrode may preferably be formed of aluminium, an aluminium alloy or a titanium/aluminium dual layer. Silicon dioxide may form the insulating layer. Below the gate insulating layer 4 is a semiconductor layer 6, typically of silicon.

The silicon layer 6 of each structure has been implanted in regions 8 and 10 with a dopant (n⁺) to define the source and drain of each TFT. Structures II and IIII also include relatively lightly doped (or n⁻) regions 12 and 14 in the silicon layer, adjoining respective regions 8 and 10 one of which will form an LDD region. Below the gate electrode 2 in each structure, there is an area of undoped silicon 16 which forms the channel of each TFT.

In each structure of FIG. 1, an offset 18 can be identified in the silicon layer 6, extending transversely from the edge of the gate electrode 2. In structures I and II, the offset is defined by the edge of the source and drain regions 8 and 10 on each side of the gate electrode, and in structure 11 it corresponds to the width of the lightly doped regions 12 and 14. In structure III, the offset is defined by the inner edges of the regions 12 and 14.

All the TFTs of FIG. 1 have a SA top-gated structure, where the gate 2 is defined prior to the dopant implant to form the source/drain regions 8, 10 and the LDD region 12/14 (structures II and III only). The dopant may be implanted without removing the gate dielectric layer 4. In each case, the region adjacent to the gate 2 was defined by controlled over-etching of the gate metal beneath the edges of the resist mask that was deposited to define the gate. Conditions were established that result in a reproducible over-etching of the gate ranging between 0.3 μm and 3 μm.

For structures I and II the source/drain regions 8, 10 are implanted after over-etching of the gate 2 leaving the resist on. For structure II this process is followed by a low-dose implant after resist removal to produce an LDD 12/14 region in the gap, where the gate has been over-etched. For the fabrication of structure III, the LDD region 12/14 may be implanted first, and after the resist has been removed the source/drain regions 8/10 are photo-lithographically defined and implanted. Alternatively, the same layer of resist may be used to define the source/drain regions and then patterned again for the LDD implantation step.

As mentioned above, it seems at present that p-channel devices do not require a field-relief architecture to meet the stability criteria for current polysilicon AMLCD applications. Reference can be made to, for example, the previously referenced article by J A Ayres et al. The device architectures shown in FIG. 1 were therefore only studied for n-channel TFTs.

The gap or offset 18 in structures I to III may be fabricated in the following way The gate electrode 2 is photo-lithographically defined and etched in a solution mixture of phosphoric, acetic and nitric acid and water (16:1:1:2, in vol %) at a temperature of 40° C. The most consistent results and smallest gap length variations are obtained when etching and over-etching of the gate are carried out in a single stage, i.e. without removing the sample from the solution mixture after etching. The length of the gap can be measured directly through the resist that defines the gate after over-etching. However, more accurate results are obtained if the gap length is calculated from the difference of the length of the resist before etching and the length of the gate after resist removal.

Figure 3:
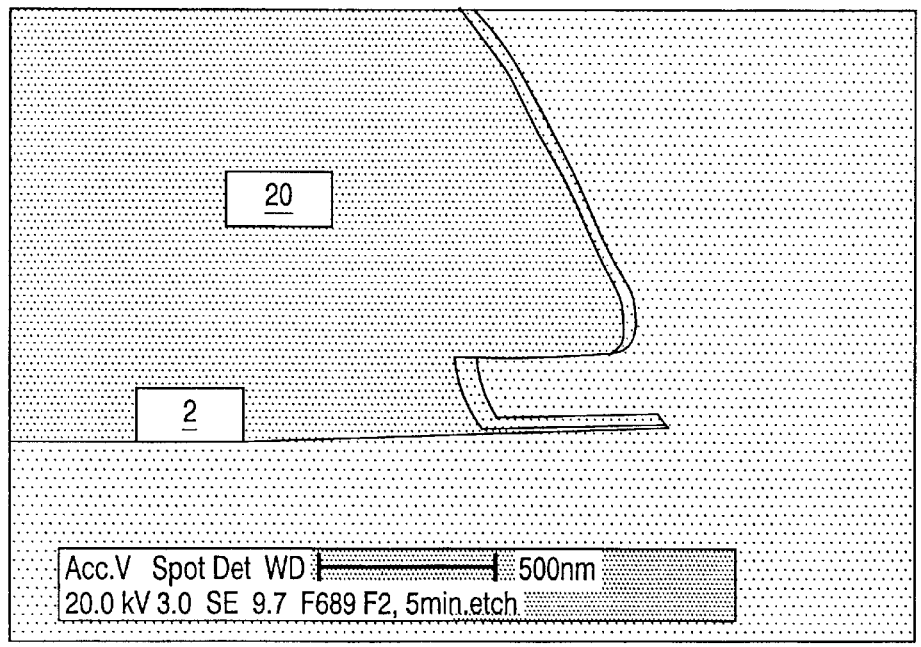
FIG. 3 is a SEM micrograph of an undercut gate.
Figure 2:
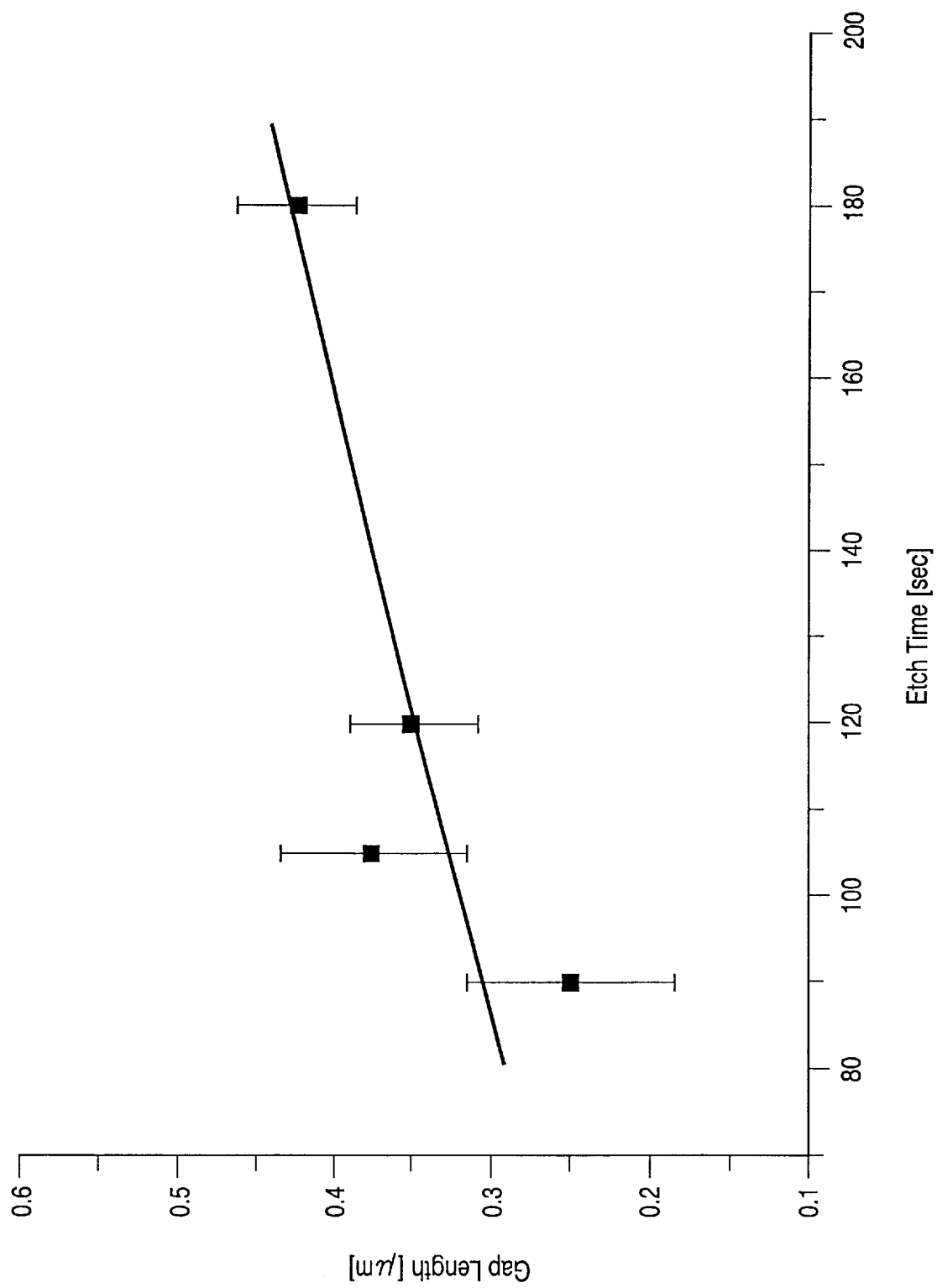
FIG. 2 is a graph showing gap length as a function of the etch time.

The relationship between gap length and total etch time is illustrated in FIG. 2 for a sputtered aluminium-titanium metal alloy (4% titanium by weight) with a thickness of 260 nm. The standard deviation increases strongly for gap lengths above 1 μm. FIG. 3 shows an SEM micrograph of the over-etched gate metal below a resist mark 20.

The over-etch technique permits formation of short, sub-micron LDD and offset regions. It also reveals the impact of residual implant damage on device performance and stability by comparison of structures I (gap) and III (n⁻ & gap) with structure II (n⁻ in gap) and current SA LDD devices. The introduction of the unimplanted gap in structures I and III is advantageous for excimer laser dopant activation as the laser beam will irradiate the entire LDD or source/drain (S/D) regions, whilst in the absence of the unimplanted gap, for devices with the S/D or LDD regions self-aligned to the gate, there may be unannealed lateral damage beneath the gate.

The TFTs with an unimplanted gap illustrate the role of broadened junctions to provide field relief. During laser activation, the dopant will diffuse laterally in the molten silicon at the gap/n⁺ junction (structure I), at the gap/n⁻ junction (structure III), as well as at the n⁻/n⁺ junction (structures II and III). However, there will be no such diffusion at the channel/n⁻ junction in structure II; instead this junction may be abrupt with the likely existence of residual implant damage. Lateral diffusion of the dopant gives junction broadening which reduces the peak electric field at the junction. This in turn reduces the avalanche current (kink effect) and inevitably any degradation attributed to hot-carrier damage. It also reduces the magnitude of the electric-field-enhanced leakage current.

TFT mobility data for the devices discussed above will now be considered with respect to FIG. 4.

Figure 4:
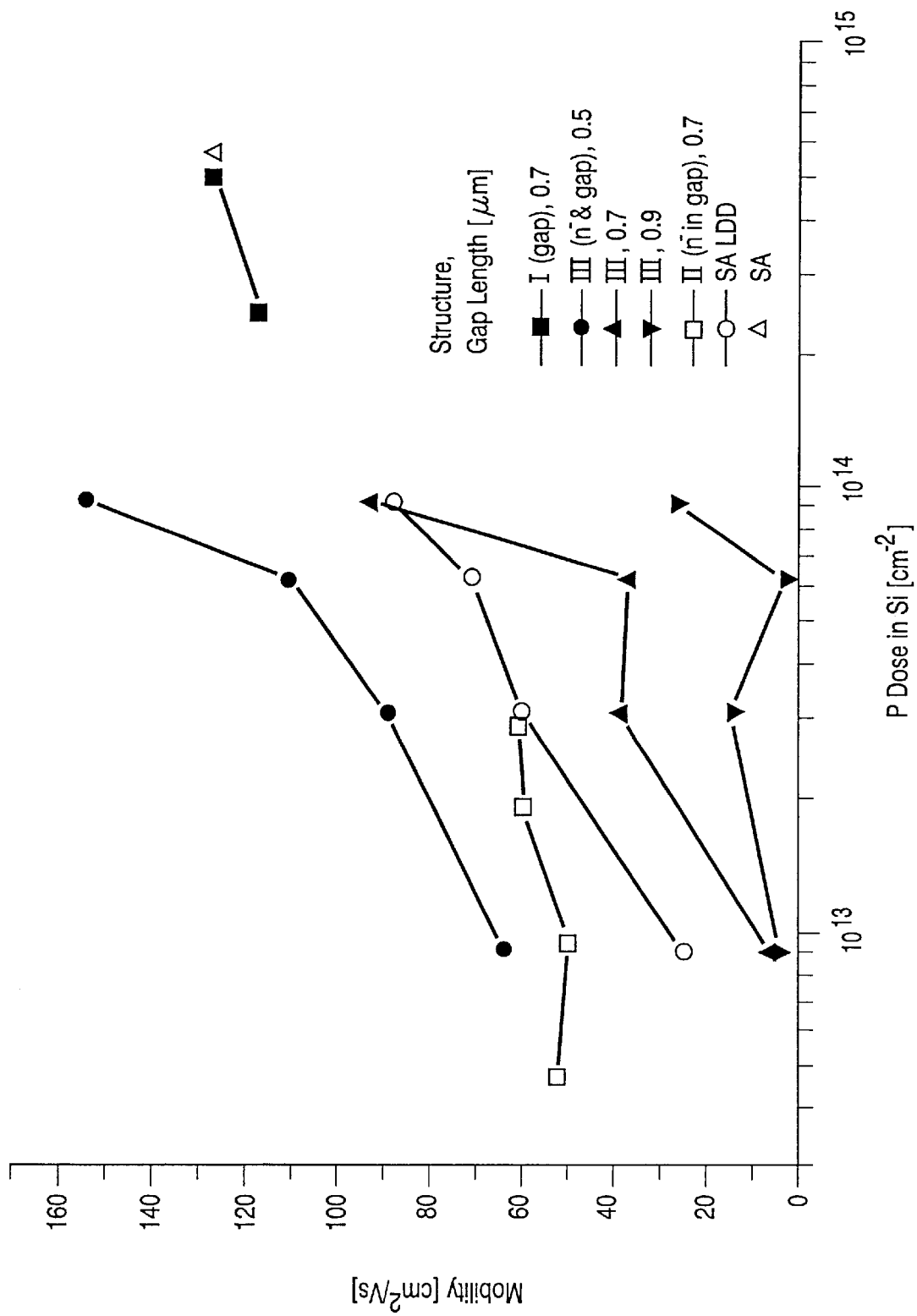
FIG. 4 is a graph showing mobility for various TFT architectures and implant doses.

FIG. 4 shows the field effect mobility of TFTs with 6 μm channel length versus implant: dose for structures I to III, together with data for SA and SA LDD devices. For structures II, III and SA LDD devices, the implant dose corresponds to the low-dose LDD implant, whilst it represents the S/D dose in SA and structure I devices. Data points are connected by lines merely to ease the distinction of data from different devices. All structure III (n⁻ & gap) and SA LDD devices have an LDD length of 3 μm.

It can be seen in FIG. 4 that the mobility increases with implant dose, which can be attributed to a decrease of the LDD or SID series resistance. The mobility decreases with increasing gap length in structures II (n⁻ in gap) and III (n⁻ & gap), and in the latter it decreases more rapidly with gap length due to the larger sheet resistance of an unimplanted offset region. However, for clarity, mobility data for only one LDD length is shown in FIG. 4. Despite the additional series resistance resulting from the 0.5 μm gap in structure III (n⁻ & gap), the mobility of these devices is higher for all LDD doses than that of SA LDD TFTs with the same LDD length of 3 μm. Indeed, structure III TFTs with an 0.5 μm gap and with a high LDD concentration of $1 \times 10^{14}$ P/cm² exhibit a larger mobility than the conventional SA TFTs, which have a mobility of typically 130 cm²/Vs for a S/D implant dose of $5 \times 10^{14}$ P/cm². This suggests that the introduction of a sub-micron offset region that is fully self-aligned to the gate enables full dopant activation by the laser, and that series resistance due to residual implant damage can result in a greater reduction in on-current than a small unimplanted offset region, into which the dopant is diffused, provided it is sufficiently small. The data in FIG. 4 demonstrate that structure III devices with 0.7 μm and 0.9 μm gaps show a strong reduction in mobility, particularly for low LDD doses.

The TFT on-current is reduced due to the S/D and LDD series resistance, R. The presence of the unimplanted gap in structures I and III, and the residual implant damage in SA, SA LDD and structure II (n⁻ in gap) devices will introduce an additional resistance ΔR, resulting in a further on-current reduction in these devices. Assuming an overall series resistance of R+ΔR, it can be shown that the mobility μ, obtained from the TFT transfer characteristic (transconductance), is related to the charge-carrier mobility in the channel, $\mu_0$, by $$\mu(V_G) = \frac{\mu_0}{\left(1 + \frac{R + \Delta R}{R_{Ch}(V_G)}\right)^2},$$

where $R_{ch}$ is the channel resistance given by $$R_{Ch} = \frac{L}{W\mu_0 C_{Ox}(V_G - V_T)}.$$

The resistance R can be calculated from the sheet resistance of low-dose (LDD) and high-dose (S/D) implanted polysilicon films (using van der Pauws measurements) and the dimensions of the LDD and S/D regions. The mobility $\mu_0$ can be estimated from TFTs with a sufficiently long channel for which the overall series resistance $R+\Delta R$ is negligible compared with the channel resistance. $\mu_0$ can also be estimated in the absence of any residual implant damage from NSA reference TFTs without LDD. Thus, measurement of the sheet resistance and the mobility $\mu$, together with an estimation of the channel mobility $\mu_0$ from suitable reference TFTs allows an estimate of the resistance of the unimplanted gap and residual implant damage.

For SA, SA LDD and structure II (n⁻ in gap) devices with a 6 $\mu$m channel length, the applicants calculated the mobility reduction expected by merely taking into account the S/D and LDD series resistance. The channel mobility $\mu_0$ was of the order of 200 to 250 cm²/Vs, and was estimated from reference TFTs with a channel length of 60 $\mu$m. For all three TFT architectures the measured mobility falls short of the mobility corrected for R only, and this points to residual implant damage. This has been identified in SA TFTs, and the results discussed herein confirm that implant damage in the vicinity of the gate edge cannot be eliminated even if the implant dose in that region is reduced by a factor of 50 as was the case for the SA LDD and structure II (n⁻ in gap) devices with the lowest LDD dose shown in FIG. 4. The resistance $\Delta R$ can be calculated from the above equation, and for all samples investigated it was found that $\Delta R$ increases with increasing implant dose, simply indicating that the degree of damage increases with dose.

The use of the above equations for structure III (n⁻ & gap) reveals that the resistance of the unimplanted gap decreases with increasing LDD dose. This decrease in resistance is the result of greater dopant concentration in the gap for higher LDD doses due to diffusion from the adjacent LDD region in the melted silicon during excimer-laser dopant activation. Similarly in structure I, a reduced gap resistance is observed in TFTs with higher S/D implant dose.

It is notable that the series resistance due to implant damage is comparable to the resistance of an 0.7 $\mu$m and an 0.5 $\mu$m unimplanted gap in structures III and I, respectively, although SEM micrographs show that the size of the region with residual implant damage is much smaller than the gap. Furthermore, unlike the unimplanted region, the region where there is residual implant damage is fully modulated by the gate, which reduces its resistance.

A low leakage current is a key requirement for polysilicon TFTs to be used as pixel TFTs in AMLCD applications. The data discussed below demonstrate the benefits of an unimplanted gap to obtain a low current in the off-state up to high gate voltages.

Figure 5:
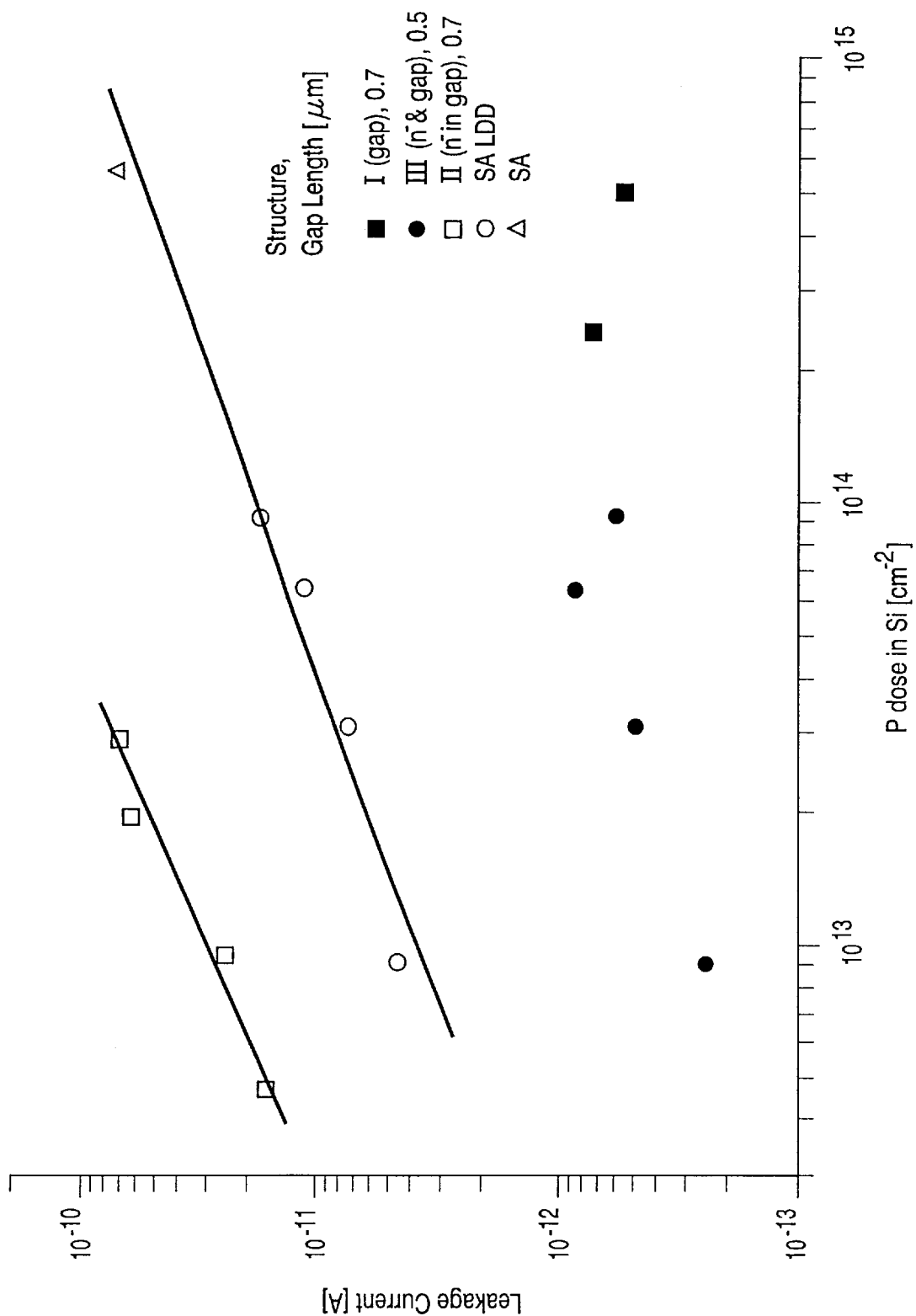
FIG. 5 is a graph showing the minimum leakage current for various devices and implant doses with a drain voltage of 5V.

FIG. 5 illustrates the relationship between minimum leakage current and implant dose for structures I to III, together with SA and SA LDD devices for comparison. The minima are at $V_G=0\pm1V$ for all devices. It is readily discernible that the introduction of an unimplanted gap drastically reduces leakage current: the presence of an 0.5 $\mu$m gap in structure III reduces the leakage current by a factor of 10 to 30 compared to both structure II (n⁻ in gap) and SA LDD devices for all LDD doses, and there is an even stronger reduction in leakage current if we compare SA with structure I devices, where there is a leakage current reduction by a factor 80. The observation of a high leakage current in SA and SA LDD may be explained by a large number of mid-gap trap states near the drain due to residual implant damage. The observed increased in leakage current with increasing dose is a consequence of the increase in implant damage with increasing dose, as identified above. In the absence of residual implant damage, the leakage current is low and independent of the dose, as can be seen in devices with unimplanted gap (structure I and III).

Figure 6:
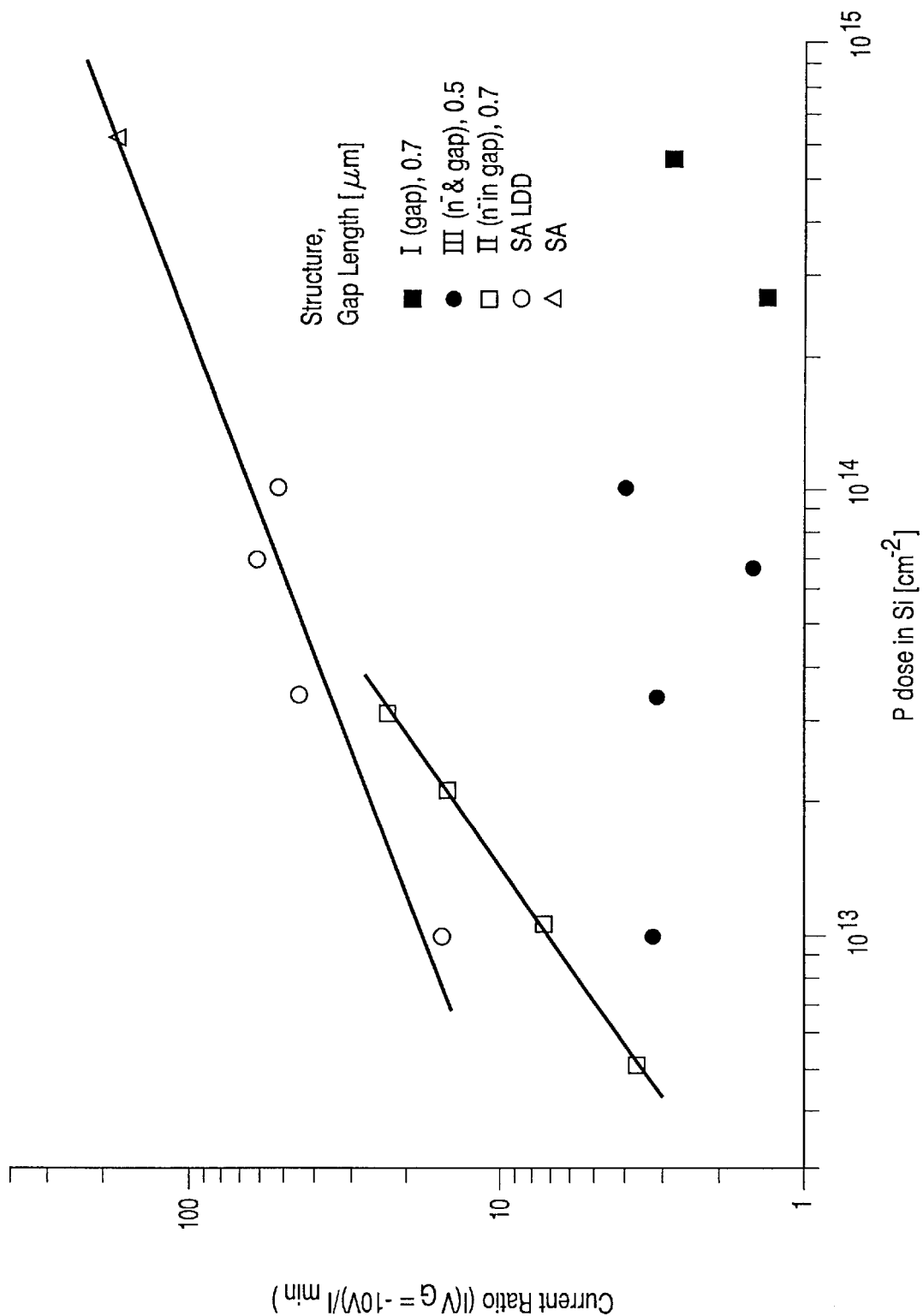
FIG. 6 is a graph showing the ratio of the leakage current at a gate voltage of −10V and the minimum leakage current as plotted in FIG. 5, for various devices and implant doses.

The data in FIG. 6 relates the minimum leakage current plotted in FIG. 5 to the current at a gate voltage of $-10V$. The ratio of these currents is plotted as a function of the implant dose. Devices with an unimplanted gap (structures I and III) exhibit a very small increase in leakage current when progressing from the current minimum at 0V to $-10V$. There is no consistent trend between current ratio and implant dose for device structures I to III. For structure II (n⁻ in gap) and SA LDD devices the leakage current ratio is larger and it increases strongly with implant dose, reaching a maximum current ratio of approximately 200 in SA TFTs.

Figure 7:
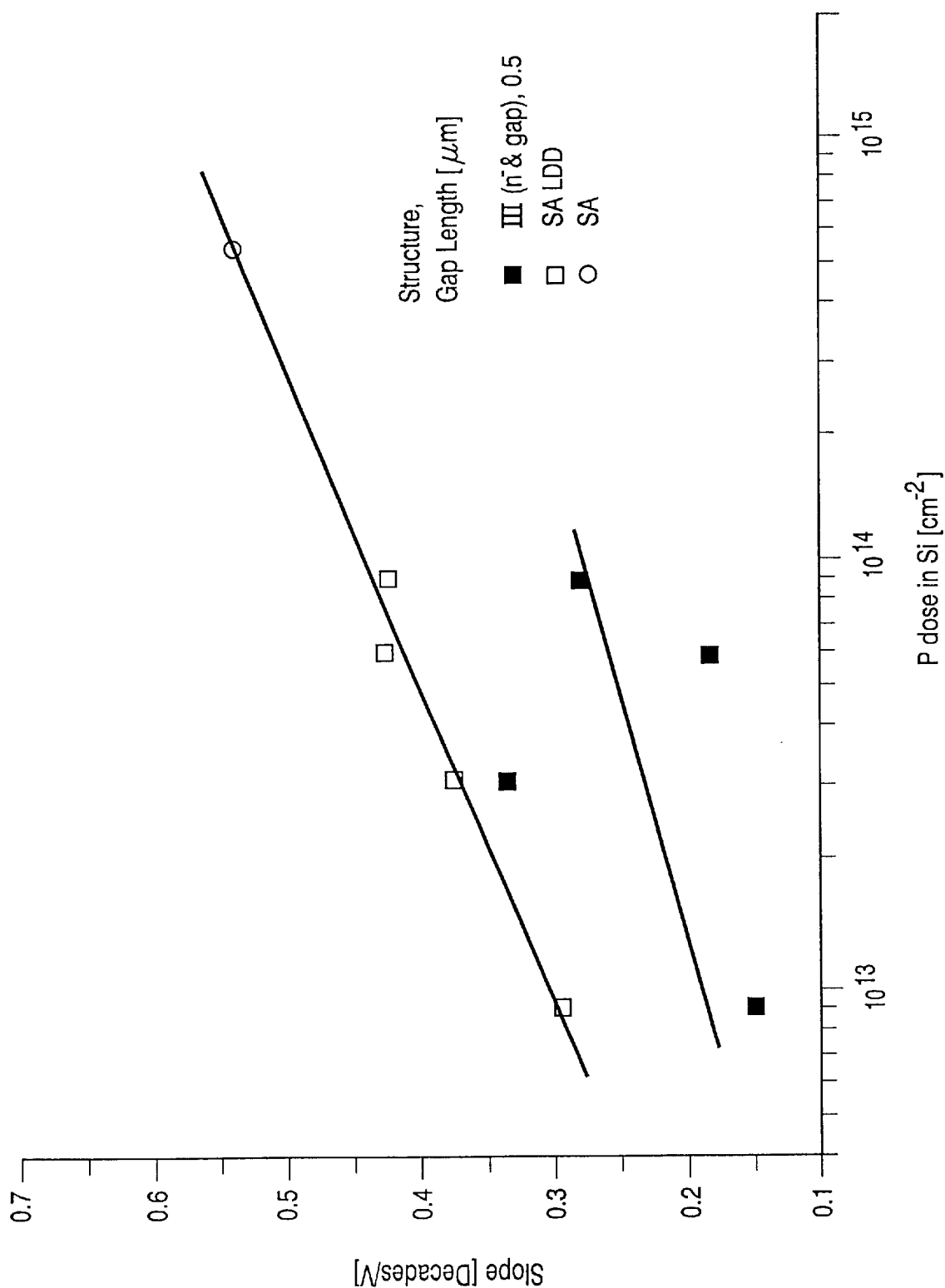
FIG. 7 is, a graph showing the slope of the log (drain current) versus drain voltage curves in the off-state at a gate voltage of −10V for various devices and implant doses.

In order to investigate the leakage current and field-relief issue further, the applicants measured the $I_D$-$V_D$ curves in the off-state, and the slope of the $\log(I_D)$-$V_D$ curve is plotted in FIG. 7 versus implant dose for a gate voltage of $-10V$. The slope is proportional to the factor which relates the electric field to the applied voltage. It can be seen that the slope is larger in SA LDD devices than in structure III (n⁻ & gap), and, despite the large fluctuation of the data with LDD dose in the latter, the data seems to suggest that the electric field increases more strongly with increasing implant dose in SA LDD and SA devices than in structure III devices. The smaller slope of the $\log(I_D)$-$V_D$ curves of structure III devices together with the lower current ratio for structure I and III devices (see FIG. 6) demonstrate clearly the benefits of field relief through broadened junctions and junction offsetting to obtain a low current in the off-state up to high gate voltages.

Finally, it will be appreciated from FIGS. 5 and 6 that, as far as leakage current and field relief are concerned, there are only minor differences between SA LDD and structure III devices (n⁻ in gap), confirming that the LDD length does not significantly affect the electric field distribution at the channel/LDD junction. This result was confirmed for LDD lengths ranging between 0.3 $\mu$m and 3 $\mu$m. For clarity, FIGS. 5 and 6 show data only for a structure II device with an 0.7 $\mu$m gap. Hence, for SA LDD devices, as far as leakage current and field relief are concerned, an LDD length of 3 $\mu$m may be reduced to sub-micron lengths without compromising leakage current using controlled over-etching of the gate.

Figure 8A:
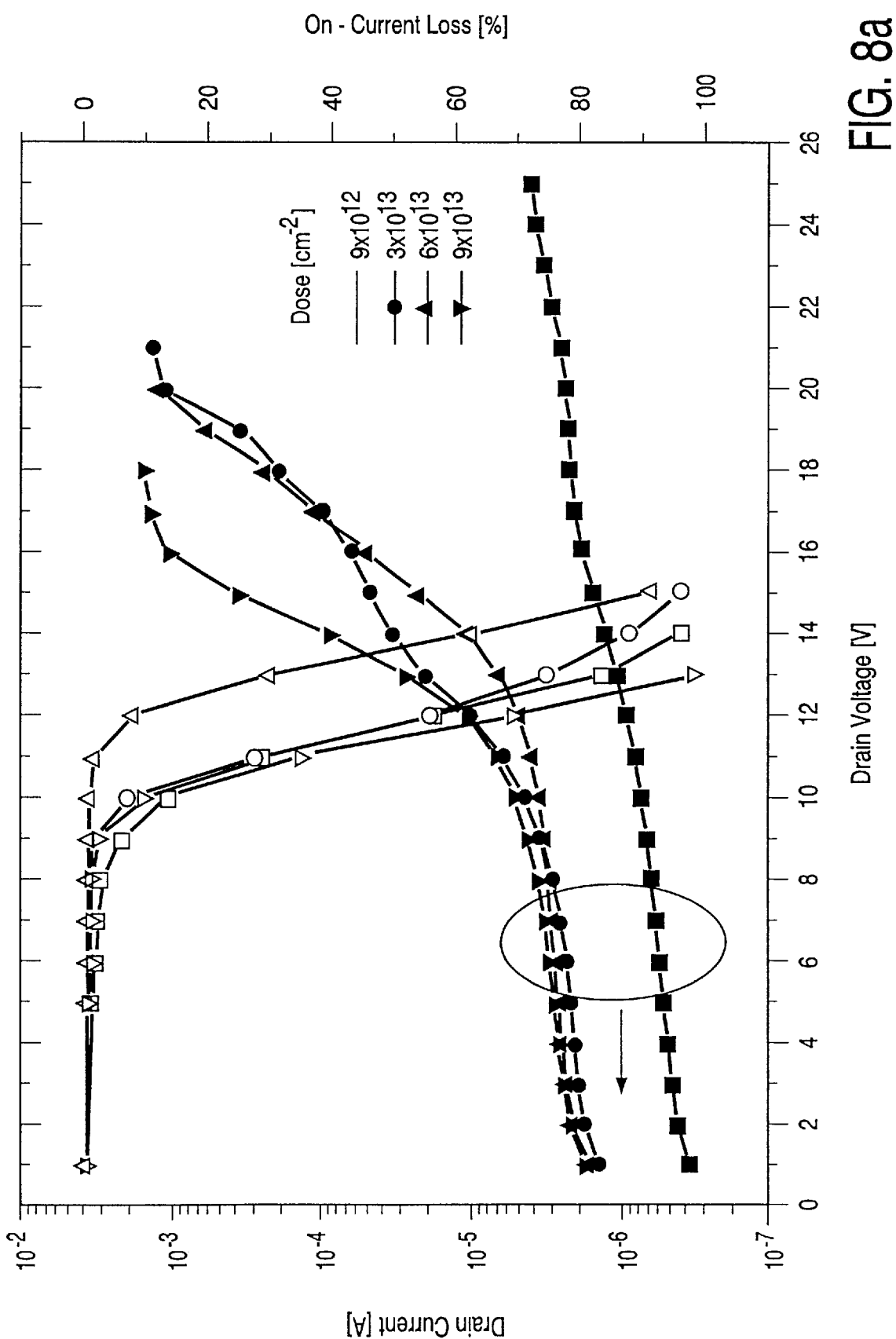
FIG. 8a is a graph showing the output characteristic at 1V below the threshold voltage, $V_T$ (closed symbols) and on-current loss (open symbols) of a structure III device (n⁻ & gap) of FIG. 1.
Figure 8B:
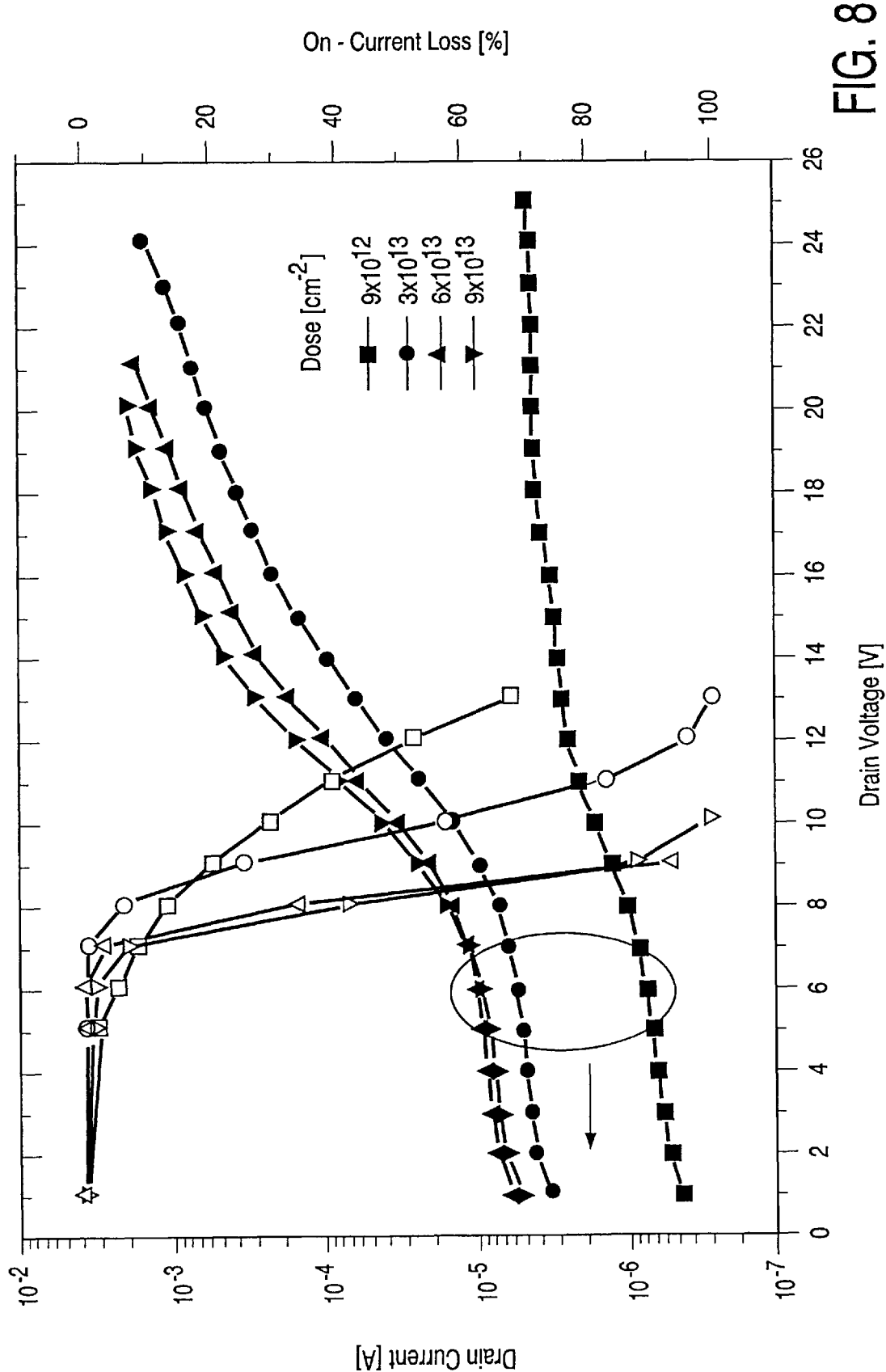
FIG. 8b is a graph showing the output characteristic at 1V below the threshold voltage, $V_T$ (closed symbols) and on-current loss (open symbols) of a SA LDD device.

FIGS. 8a and 8b show the output characteristics (closed symbols), recorded at $V_T$-IV, of structure III devices (n⁻ & gap) and SA LDD devices, respectively, with various LDD implant doses. It can be seen that the drain current increases strongly with LDD dose for both device architectures; in particular, there is a critical doping range between $9\times10^{12}$ and $3\times10^{13}$ P/cm² within which the current increases strongly for both architectures. It can also be seen that the critical drain voltage above which the current increases strongly, decreases with increasing implant dose. For the two highest doses in FIGS. 8a and 8b the kink effect is shifted by approximately 2V to higher drain voltages in structure III TFTs. These measurements clearly demonstrate that drain-field relief is achieved with low-dose implants and that this effect is increased by broadened offset junctions. These results are consistent with the leakage current data discussed above.

The stability of device structures I to III was compared to the stability of our standard SA LDD devices. Some of these results are summarised in FIGS. 8a and 8b, which display the TFT on-current loss (open symbols) in the linear region, after the application of drain bias stressing for one minute, during which time the gate bias was set to the threshold voltage, which represents the worst case stressing condition.

Figure 9:
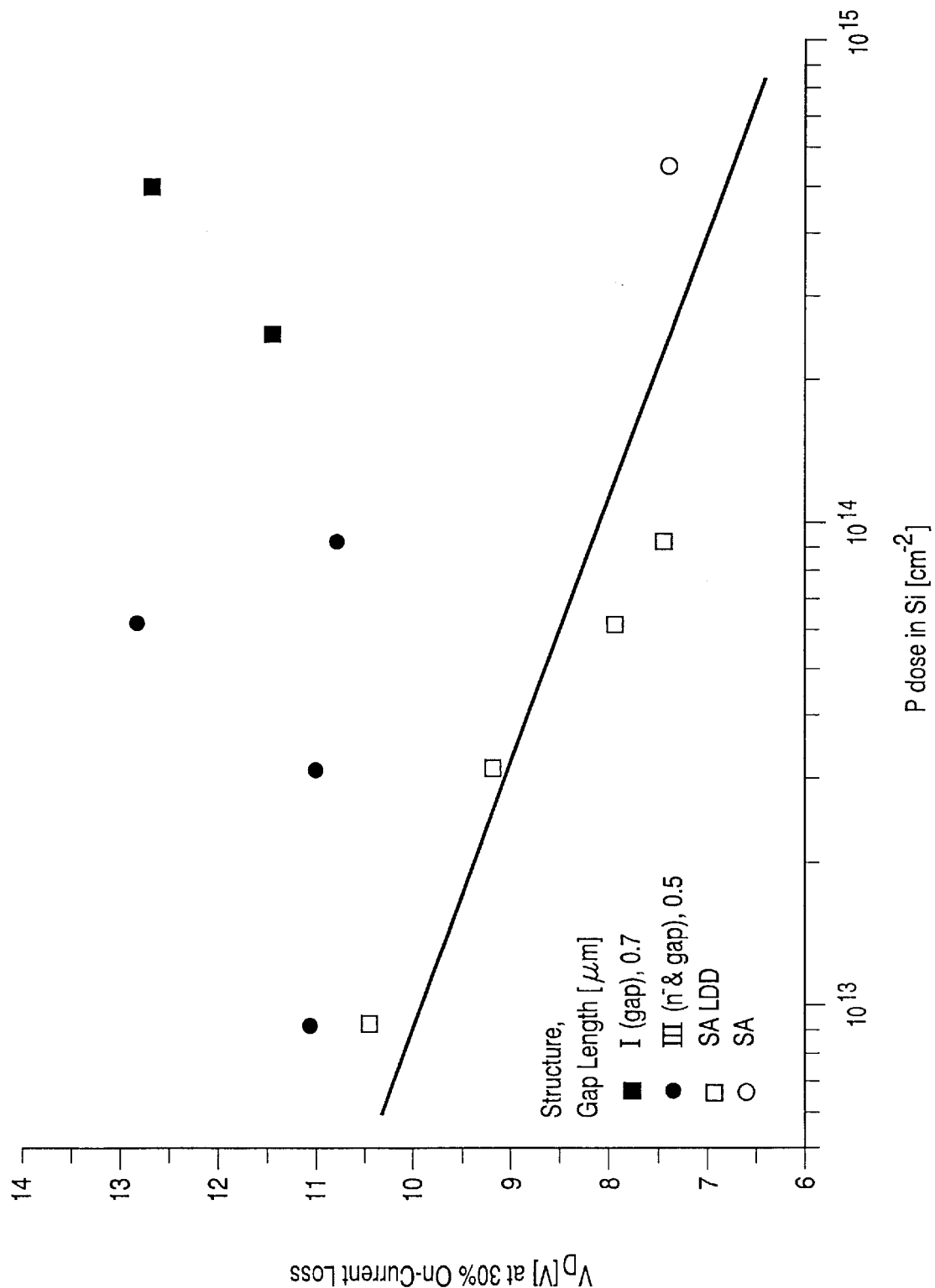
FIG. 9 is a graph showing the characteristic drain voltage at which there is a 30% on-current loss after 1 min stress plotted as a function of implant dose for different device architectures.

Derived from the data shown in FIGS. 8a and 8b, FIG. 9 compares the characteristic drain voltages at which the two device architectures in FIGS. 8a and 8b exhibit an on-current reduction of 30%. Data for structure I devices (gap) are also shown. It is discernible that the introduction of a gap improves device stability by 1–3V for structure III devices. SA LDD devices become less stable with increasing LDD dose, approaching that of the SA device. From the data in FIG. 9, there is no monotonic relationship between stability and LDD dose in structure III devices. For devices with an implant dose of $6 \times 10^{13}$ P/cm$^2$ a higher stability is obtained, and from the data it is not clear whether this is an artefact or whether there is a small implant dose window within which improved stability can be obtained. For structure II (n⁻ in gap) devices, the stability is independent of the length of the LDD region for a length between 0.31 μm and 3 μm. The stability of these devices decreases with increasing LDD dose, and it is comparable to SA LDD devices.

The introduction of a small offset region (structures I and II) addresses problems that have been identified for conventional SA and SA LDD TFTs. These devices show a low on-current due to series resistance, a high leakage current and poor stability. There is a reduction in mobility in laser-activated SA and SA LDD devices due to residual implant damage in the vicinity of the gate edge. In the presence of an unimplanted gap, implant damage can be removed fully as the laser irradiates the entire LDD and S/D region, resulting in devices with a higher mobility and a lower leakage current. The additional series resistance due to the offset region does not present an issue, provided its length is less than 0.5 μm. The gap provides field relief through junction broadening and offsetting. This results in a considerable reduction of the electric-field-enhanced leakage current. It also reduces avalanching and improves the device stability.

The TFTs of FIG. 1 have an unimplanted gap exposed to the laser anneal by the etch back of the gate. FIG. 10 shows a process that can be used to optimise a SA GOLLD TFT with regard to a low gate-drain capacitance and low leakage currents. In this case, the gap area exposed to the laser anneal is a previously implanted, previously annealed LDD region (n–).

In FIG. 10(a) a device island 30 has been formed on a substrate 32, and lightly doped n-regions 34 and 36 have been formed by implantation using a resist mask (not shown). These will eventually form LDD regions 33 and 35. Also, shown (dotted schematically) is damage associated with the ion implantation. This extends throughout the implanted region and also laterally beyond the lines 38 and 40 which correspond to the position of the mask edges (as does the doping) by an amount typically equal to the implant range.

In FIG. 10(b) the film is annealed by an energy beam 42, typically of laser radiation. This crystallises the material to form good quality polysilicon, activates the n– dopant, anneals out the damage, and additionally may cause a small amount of lateral dopant diffusion (less than 0.25 micron) causing gradation of the junction edge.

In FIG. 10(c) a gate structure is formed by depositing insulator 44, then metal 46, and then patterning and etching the metal with photoresist 48. The metal is preferably highly reflecting and smooth, and may comprise Al alloy or a Ti/Al dual layer. A high dose n+ of phosphorus ions 50 is now implanted to form source and drain contacts 52 and 54. This process sequence is the basis of the known self-aligned gate-overlapped lightly-doped-drain structure (SAGOLDD). SAGOLLD has the gate overlapping the LDD region 33/35 (which is essential for the highest stability) but has minimised overlap capacitance due to the self-aligning of the LDD/n+ junction to the gate.

However, FIG. 10(c) shows implant damage (dotted schematically) associated with the n+, which extends laterally under the gate 46. It is normal to do a second laser anneal at this stage to activate this dopant, but this leaves a damage region under the gate where the laser light can not penetrate.

In FIG. 10(d) illustrates an additional process step, which is to re-etch the metal back (as shown by arrows 5b), typically by 0.25–0.5 micron, so that the damage region becomes accessible to the laser light 42 (FIG. 10(e)). The implanted photoresist is a very stable and hard mask. This laser step activates the n+ dopant, removes the lattice damage and grades the transition of the n+ to the n–. In this way, 2 LDD sub-regions are formed (one, 58, that is overlapped, and one, 60, non-overlapped) as shown in FIG. 10(f), and no residual damage remains. The non-overlapped sub-region 60 is very narrow and does not add any appreciable series resistance.

An advantage of inventive processes disclosed herein is that a photoresist mask 48 is hardened by the implant, making it a very robust mask for the etch back, if this is carried out after implantation. Typically, oxygen plasma ashing is then required for removal of the mask.

Immersion etching is preferred for the etch-back. However, it will be apparent to persons skilled in the art that alternate processes may be used. If spray etchers are used instead, the desired etch back may be more difficult to achieve with a high degree of reproducibility. In this case, the desired etch-back could be achieved precisely with wet anodisation (for example in diethelyene glycol) or by plasma anodisation. A complex triple anodisation scheme is described in the Yoshinouchi et al. paper, AMLCD workshop 1996 p29–31, where it is used for forming LDD regions (within a non-overlapped TFT device). The whole contents of this AMLCD Workshop paper are hereby incorporated herein as background material. At least one of the three anodisations is required just to form a hard mask on the top metal surface for the lateral anodisation. The techniques described herein may also be beneficial for that device process since the hardened resist masking may replace this hard mask anodisation step and so reduce the number of anodisations required.

From reading the present disclosure, other variations and modifications will be apparent to persons skilled in the art. Such variations and modifications may involve equivalent and other features which are already known in the design, manufacture and use of electronic devices comprising thin-film circuits, semiconductor devices, and component parts thereof, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. Features which are described in the context of separate embodiments may also be provided in combination in a single embodiment. Conversely, various features which are, for brevity, described in the context of a single embodiment, may also be provided separately or in any suitable subcombination.

The Applicants hereby give notice that new claims may be formulated to such features and/or combinations of such features during the prosecution of the present Application or of any further Application derived therefrom.

What is claimed is:

1. A method of fabricating an electronic device comprising an thin-film transistor, comprising the steps of:
   (a) depositing a gate layer over an insulating film, which is over a semiconductor film;
   (b) defining a patterned mask layer over the gate layer;
   (c) etching to pattern a predetermined distance of the gate layer using the mask layer;
   (d) implanting the semiconductor film, using the mask layer and/or the gate layer as an implantation mask to generate a source region and a drain region, and at least a first doped sub-region which is overlapped by the gate layer and an offset sub-region;
   (e) over-etching of the gate layer beyond the predetermined distance ranging between about 0.3 um and 3 um to provide an unimplanted gap;
   (f) removing the mask layer; and
   (g) annealing the semiconductor film with an energy beam.

2. The method of claim 1, further comprising an implantation step after step (f), providing a lower level of doping than step (d).

3. The method of claim 1, wherein step (b) comprises the steps of:
   (h) defining a source/drain pattern mask layer;
   (i) performing an implantation step which provides a higher level of doping than step (d) to form source and drain regions defined by the source/drain pattern, with areas exposed only to the step (d) implantation forming LDD regions; and
   (j) patterning the mask layer to define a gate pattern.

4. The method of claim 1, further comprising, after step (c), the steps of:
   (k) defining a source/drain pattern in another mask layer; and
   (l) performing an implantation step which provides a higher level of doping than step (d) to form source and drain regions defined by the source/drain pattern, with areas exposed only to the step Cd) implantation forming LDD regions.

5. The method of claim 1, further comprising, prior to step (a), the steps of;
   (m) defining an initial patterned mask layer;
   (n) performing an implantation step using the initial mask layer of doping than step (d) in regions extending laterally and inwardly beyond the edges of the patterned mask formed in step (b); and
   (o) annealing the semiconductor film with an energy beam.

6. The method of claim 5, wherein after the etching back of step (e), the gate layer overlaps a portion of the implanted regions formed in step (n).

7. The method of claim 1, further comprising the step of (p) anodising the gate layer prior to step (e).

8. The method of claim 7, wherein step (d) is carried out before step (p).

9. The method of claim 1, wherein the distance that the gate is etched back in step (e) is 3 $\mu$m or less.

10. The method of claim 8, wherein the distance that the gate is etched back in step (e) is in the range 0.25 to 0.5 $\mu$m.

11. The method of claim 1, wherein the gate layer comprises aluminium or a titanium and aluminium dual layer.

12. The method of claim 1, wherein a plurality of the transistors are formed on a substrate as switching elements in a matrix.

13. A method of fabricating an electronic device comprising a thin-film transistor, comprising the steps of;
   (a) depositing a gate layer over an insulating film, which is over a semiconductor film;
   (b) defining a patterned mask layer over the gate layer;
   (c) etching to pattern by a predetermined distance the gate layer using the mask layer;
   (d) over-etching back of the gate layer beyond the predetermined distance ranging between about 0.3 um and 3 um to provide an unimplanted gap under the mask layer;
   (e) implanting the semiconductor film, using the mask layer and/or the gate layer as an implantation mask to generate a source reunion and a drain region, and at least a first doped sub-region which is overlapped by the gate layer and an offset sub-region;
   (f) removing the mask layer; and
   (g) annealing the semiconductor film with an energy beam.

14. The method of claim 13, wherein step (c) and step (d) are carried out as a single processing step.

15. The method of claim 13, further comprising an implantation step after step (f), providing a lower level of doping than step (d).

16. The method of claim 13, wherein step (b) comprises the steps of;
   (h) defining a source/drain pattern mask layer;
   (i) performing an implantation step which provides a higher level of doping than step (d) to form source and drain regions defined by the source/drain pattern, with areas exposed only to the step (d) implantation forming LDD regions; and
   (j) patterning the mask layer to define a gate pattern.

17. The method of claim 13, further comprising, after step (d), the steps of:
   (k) defining a source/drain pattern in another mask layer; and
   (l) performing an implantation step which provides a higher level of doping than step (a) to form source and drain regions defined by the source/drain pattern, with areas exposed only to the step (e) implantation forming LDD regions.

18. The method of claim 13, further comprising, prior to step (a), the steps of:
   (m) defining an initial patterned mask layer;
   (n) performing an implantation step using the initial mask layer of doping than step (d) in regions extending laterally and inwardly beyond the edges of the patterned mask formed in step (b); and
   (o) annealing the semiconductor film with an energy beam.

19. The method of claim 18, wherein after the etching back of step (d), the gate layer overlaps a portion of the implanted regions formed in step (n).

20. The method of claim 1, further comprising the step of (p) anodising the gate layer prior to step (f).

* * * * *